United States Patent
Hashino

[11] Patent Number: 5,122,749
[45] Date of Patent: Jun. 16, 1992

[54] MAGNETIC RESONANCE IMAGING APPARATUS

[75] Inventor: Kazuya Hashino, Tokyo, Japan

[73] Assignee: Yokagawa Medical Systems, Limited, Tokyo, Japan

[21] Appl. No.: 555,490

[22] PCT Filed: Feb. 15, 1989

[86] PCT No.: PCT/JP89/00154
§ 371 Date: Jul. 30, 1990
§ 102(e) Date: Jul. 30, 1990

[87] PCT Pub. No.: WO89/07416
PCT Pub. Date: Aug. 24, 1989

[30] Foreign Application Priority Data

Feb. 15, 1988 [JP] Japan .................. 63-32083

[51] Int. Cl.$^5$ ............................. G01R 33/20
[52] U.S. Cl. .......................... 324/309; 324/322
[58] Field of Search ............ 324/300, 307, 318, 320, 324/322; 128/653 A, 653 SC; 335/219

[56] References Cited

U.S. PATENT DOCUMENTS

| | | |
|---|---|---|
| 4,816,765 | 3/1989 | Boskamp ................ 324/318 |
| 4,859,947 | 8/1989 | Boskamp ................ 324/318 |
| 4,943,775 | 7/1990 | Boskamp et al. ....... 324/322 |
| 4,973,907 | 11/1990 | Bergman et al. ....... 324/318 |

*Primary Examiner*—Michael J. Tokar
*Attorney, Agent, or Firm*—Moonray Kojima

[57] ABSTRACT

A magnetic resonance imaging apparatus having a reduced bulk of hardware for MR signal reception and requiring fewer computations for image reconstruction. The apparatus comprises a plurality of MR signal receiving RF coils, a plurality of signal composers, a plurality of receivers and an image reconstructing device. The RF coils correspond to an object body's sensitive areas which overlap with one another where their corresponding coils adjoin one another. Each of the signal composers addresses one group of RF coils whose sensitive areas do not overlap, the received signals of the coils being composed into one received signal. The receives perform signal processes such as detection and A/D conversion on the output signals from the signal composers. The image reconstruction device reconstructs images based on the outputs from the receivers and composes the reconstructed images into a single image.

5 Claims, 5 Drawing Sheets

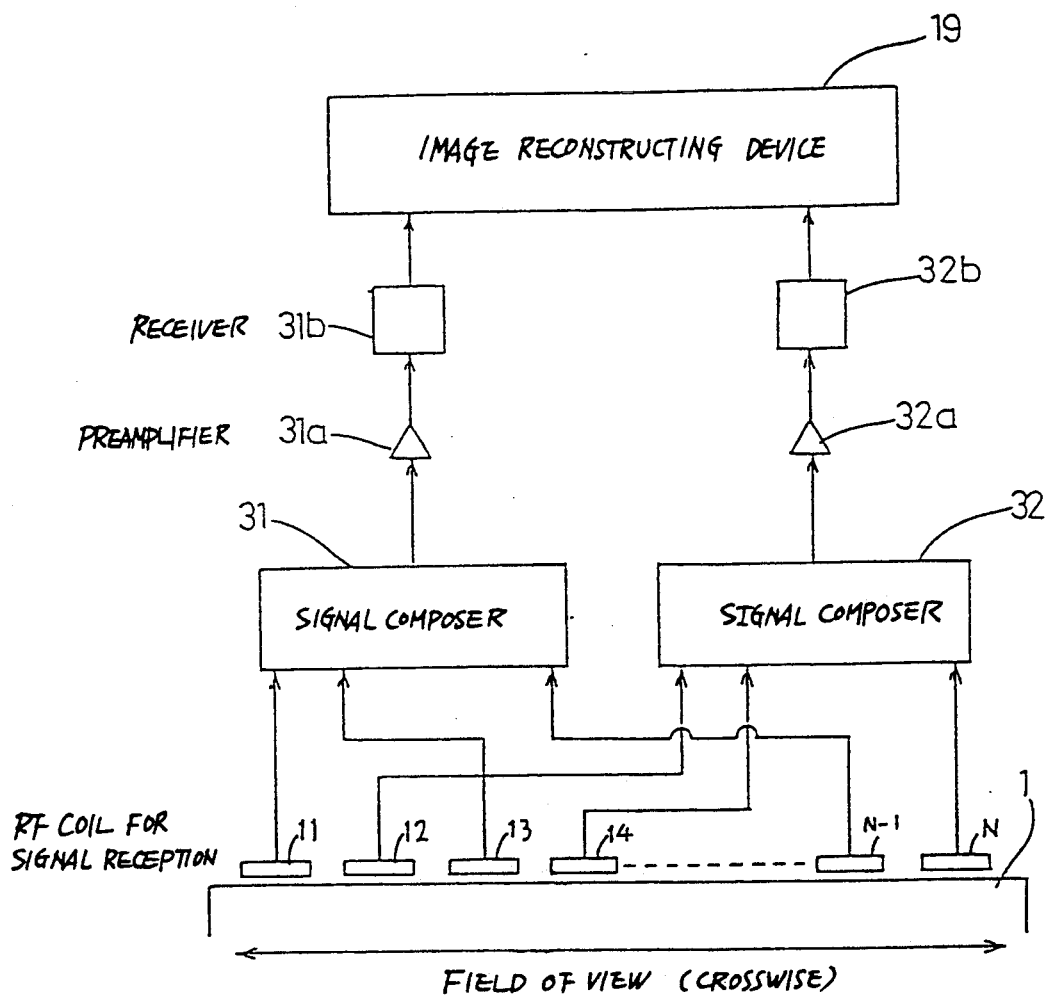

MAGNETIC RESONANCE IMAGING APPARATUS

TECHNICAL FIELD

The present invention relates to a magnetic resonance imaging apparatus that reconstructs an image using magnetic resonance signals received by a plurality of radio frequency coils.

PRIOR ART

With the magnetic resonance imaging (MRI) apparatus, radio frequency magnetic resonance signals (MR signals) generated in an object body are received by radio frequency coils (RF coils). This process may operate on the so-called multiple coil method whereby a plurality of RF coils receive MR signals, as illustratively shown in FIG. 5. This figure depicts a prior art case where a tomogram is taken of a backbone 2 in an object body 1. A plurality of RF coils 3 are positioned on the back of the object body 1 along the backbone 2 in order to receive the MR signals from within the body. FIG. 6 highlights an RF signal receiving system of a prior art MRI apparatus operating on the multiple coil method. In FIG. 6, reference numerals 11 through N designate a plurality of RF coils arranged parallel to the slice plane of the object body 1. RF signals received by the RF coils are amplified respectively by preamplifiers 11a through Na. The amplified signals enter receivers 11b through Nb that perform such signal processes as frequency conversion, amplification, detection and analog-to-digital (A/D) conversion. The processed signals then enter an image reconstructing device 19. The image reconstructing device 19 reconstructs a plurality of images based on the multiple input signals, and combines these images into a single image. Reference numeral 20 is the object body's sensitive area corresponding to each of the RF coils 11 through N. Adjoining sensitive areas have a mutually overlapping portion therebetween. The images stemming from these sensitive areas are reconstructed by the image reconstructing device 19 into a single image. This multiple coil method is characterized by the fact that the overall sensitive region corresponding to the received MR signals is extensive in the field of view (crosswise) but shallow in the object body's depth direction. That is, the method is suitable for the imaging of backbones or like areas with good S/N ratios. One disadvantage of the multiple coil method is the need for an expanded hardware construction involving pluralities of preamplifiers and receivers associated with the multiple RF coils. Another disadvantage is that the image reconstructing device 19 is required to perform greater amounts of computations for image reconstruction because the device must reconstruct each one of the images associated with the sensitive areas of the coils based on the RF signals coming therefrom.

OBJECT AND SUMMARY OF THE INVENTION

It is therefore an object of the present invention to provide a magnetic resonance imaging (MRI) apparatus which reduces the bulk of the hardware for MR signal reception and lowers the amount of computations for image reconstruction while operating on the multiple coil method for imaging.

In carrying out the invention, there is provided an MRI apparatus comprising a plurality of radio frequency (RF) coils, a plurality of signal composers (also called "preprocessors," with both terms being used interchangeably in the specification, claims and drawing; the functions thereof are set forth in greater detail hereinbelow.), a plurality of receivers, and an image reconstructing device. The RF coils are positioned on the surface of an object body to receive MR signals coming therefrom, the sensitive areas of the adjoining RF coils having a mutually overlapping portion therebetween. The signal composers are provided to address each group of RF coils whose sensitive areas do not overlap. One signal composer composes a single received signal out of the signals from the RF coils in one group. The receivers carry out such signal processes as detection and A/D conversion on the signals coming from the signal composers. The image reconstructing device reconstructs images based on the output signals from the receivers and puts these images together into a single reconstructed image.

BRIEF DESCRIPTION OF THE DRAWINGS

FIG. 1 is a view conceptually showing the construction of a first embodiment of the present invention;

BEST MODE FOR CARRYING OUT THE INVENTION

Figure 6:
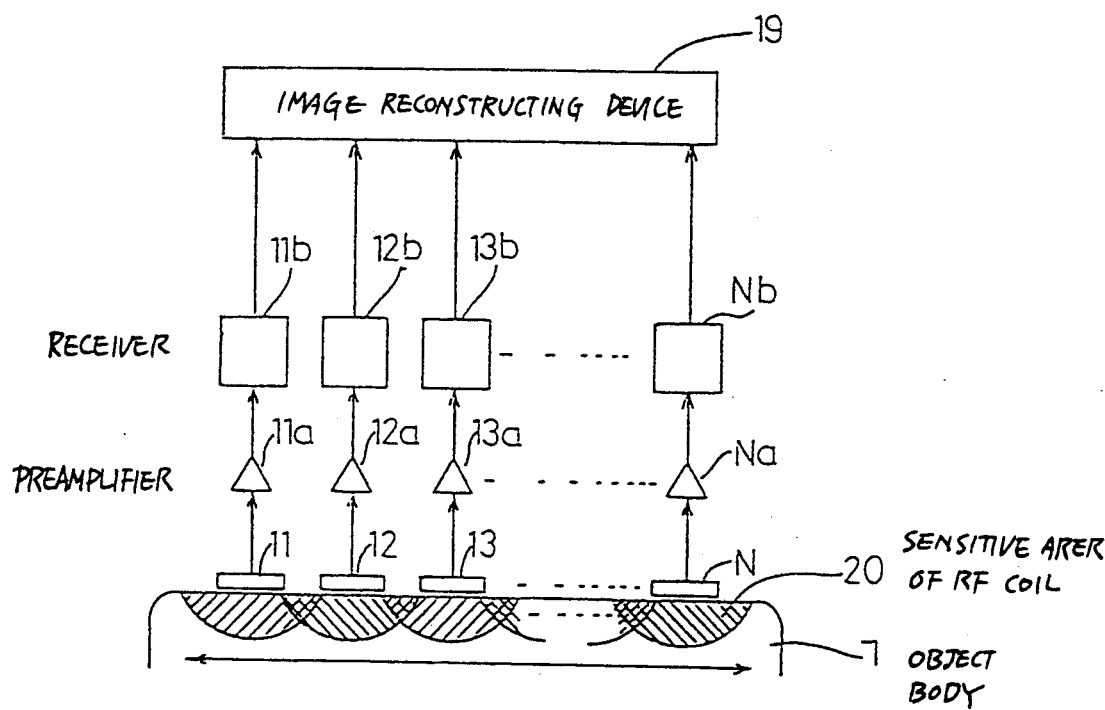
FIG. 6 is a view conceptually describing the construction of a prior art MRI apparatus operating on the multiple coil method.

Preferred embodiments of the present invention will now be described by referring to the accompanying drawings. FIG. 1 is a conceptual view of how the first embodiment of the invention is constructed. In FIG. 1, reference numerals 11 through N are a plurality of RF coils positioned along the slice plane of an object body 1. As in the prior art example of FIG. 6, The RF coils 11 through N are associated with their respective sensitive areas. The sensitive areas of adjoining RF coils share an overlapping portion between. Numeral 31 is a first signal composer, or preprocessor which receives signals from odd-numbered RF coils 11 through N−1 and which generates a signal based on these input signals. Numeral 32 is a second signal composer, or preprocessor, which receives signals from even-numbered RF coils 12 through N and which also generates a signal based on these input signals. Numerals 31a and 32a are preamplifiers that respectively amplify the outputs from the signal composers 31 and 32. Numerals 31b and 32b are receivers that perform such signal processes as frequency conversion, amplification, detection and A/D conversion on the output signals from the preamplifiers 31a and 32a, respectively. Numeral 19 is an image reconstructing device that reconstructs an image using the output signals from the receivers 31b and 32b. There are also provided mechanisms for generating a magnetostatic field, a plurality of gradient magnetic fields, and a radio frequency magnetic field affecting the object body 1. These mechanisms are the same as those of conventional MRI apparatus and are thus omitted from the figure.

Figure 2A:
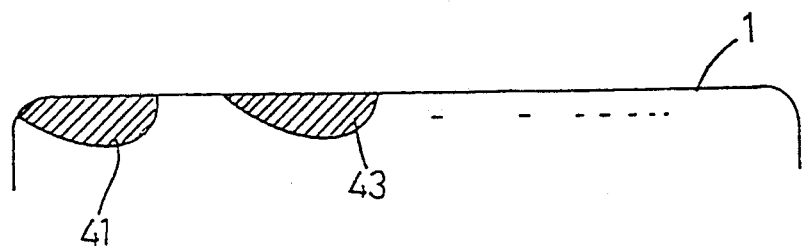
FIGS. 2A, 2B and 2C are views that help to describe how images are reconstructed by the first embodiment.
Figure 2B:
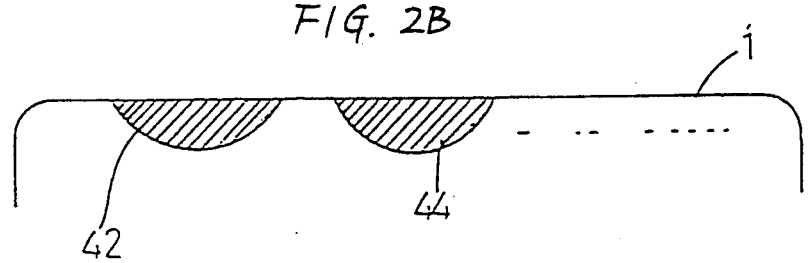
Figure 2C:
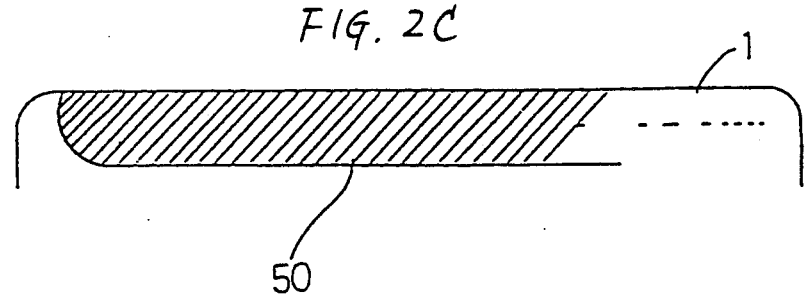

The first embodiment works as follows. Of the RF coils that have received MR signals, the odd-numbered RF coils 11 through N−1 forward their MR signals to the first signal composer 31. The signal composer 31 composes the received signals into a signal received signal. Likewise, the even-numbered RF coils 12 through N forward their MR signals to the second signal composer 32 which composes these signals into another received signal. The received signals from the signal composers 31 and 32 are amplified by the preamplifiers 31a and 32a, respectively. The amplified signals are subjected to such signal processes as frequency conversion, amplification, detection and D/A conversion by the receivers 31b and 32b. The processed signals then enter the image reconstructing device 19. It is to be noted that while the sensitive areas of adjoining RF coils overlap with one another, every second coil, i.e., any of odd-numbered or even-numbered RF coils, does not share an overlapping sensitive portion with its neighboring coils. Thus when the signals from within the group of odd-numbered or even-numbered RF coils are composed by the signal composer 31 or 32, the signals do not cancel one another because of their overlapping portions. This allows two different images to be reconstructed based on the two signals composed by the signal composers 31 and 32. The received signal from the first signal composer 31 causes shaded images of FIG. 2A to be reconstructed, while the signal from the second signal composer 32 results in reconstructed images shown shaded in FIG. 2B. In these figures, reference numerals 41 through 44 are the reconstructed images respectively corresponding to the sensitive areas of the RF coils 11 through 14. The image reconstructing device 19 composes the reconstructed images from these two sections into one image 50 shown in FIG. 2C. The image 50 is the sum of all images associated with the sensitive areas of all RF coils. This embodiment only requires two receiving sections (each comprising preamplifiers, receivers, etc.) and two passes of image reconstruction computations regardless of the number of the RF coils configured. In an example where eight RF coils are used, the bulk of the receiving section hardware and the amount of image reconstruction computations are both reduced to one fourth of the levels of the comparable prior art.

Figure 3:
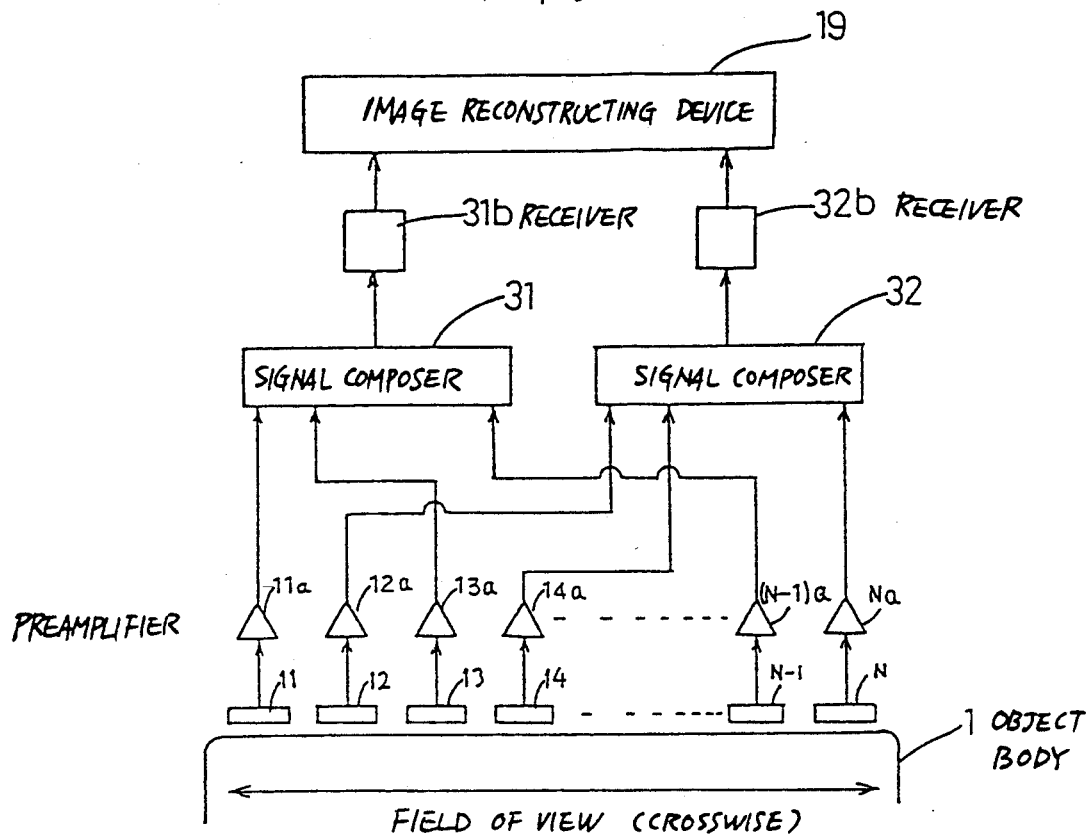
FIG. 3 is a view conceptually depicting the construction of a second embodiment of the present invention.
Figure 4:
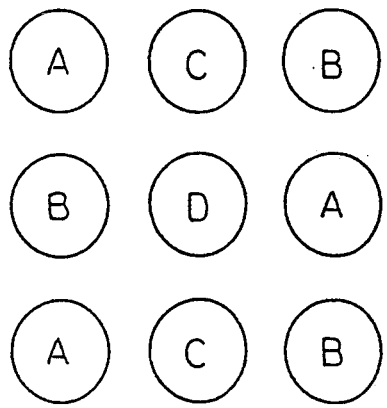
FIG. 4 is a view of an alternative arrangement of RF coils for use with the embodiment.
Figure 5:
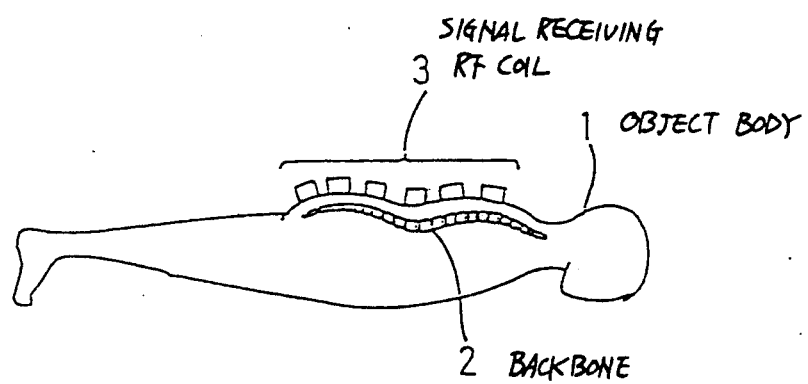
FIG. 5 is a view showing how RF coils are illustratively used by the multiple coil method.

When feeble signals from the RF coils 11 through N are directly input to signal composers whose signal loss level is not sufficiently low, the signal-to-noise ratio may deteriorate. This is where the second embodiment of the invention comes in. With the second embodiment, the signals from the RF coils 11 through N are amplified by preamplifiers 11a through Na before they are input to the signal composers 31 and 32, as shown in FIG. 3. Although the number of preamplifiers remains the same, the bulk of the hardware downstream of the receivers may be reduced, and so is the amount of the image reconstruction computations involved. The present invention may also be practiced with an alternative arrangement of RF coils. Instead of being positioned in a single row, the multiple RF coils may be arranged in a two-dimensional pattern, as depicted in FIG. 4. The area of the 2D coil pattern is the same as that of the single-row coil arrangement. Of the nine RF coils shown in FIG. 4, those not adjoining one another are connected to a different signal composer for signal composition. That is, three RF coils marked "A" are connected to a signal composer, three RF coils marked "B" to another signal composer, two RF coils marked "C" to yet another signal composer, and one RF coil is connected to one signal receiver. Thus there are four received signals made available, which means that nine RF coils require only four sections of the signal receiving hardware and four passes of image reconstruction computations.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A magnetic resonance imaging apparatus comprising a plurality of RF coils which receive magnetic resonance signals and which are positioned along the surface of an object body, said plurality of RF coils corresponding to sensitive areas of said object body, said sensitive areas sharing an overlapping portion therebetween where their corresponding ones of said plurality of RF coils adjoin one another;

a plurality of signal preprocessors, each associated with a different group of said plurality of RF coils whose corresponding sensitive areas do not overlap with one another, said each of said plurality of preprocessors taking received signals from the RF coils within one group and preprocessing said received signals and based thereon generating a single output signal therefrom;

a plurality of receivers for detecting and analog-to-digital converting the output signals from said plurality of signal preprocessors; into a plurality of output signals; and image reconstructing means for reconstructing images from the output signals from said plurality of receivers and for processing said reconstructed images into a single image.

2. The apparatus of claim 1, further comprising a plurality of preamplifiers disposed between said plurality of signal preprocessors and said plurality of receivers, wherein said preamplifiers are arranged to amplify the output signals from said plurality of signal preprocessors before said output signals reach said plurality of receivers.

3. The apparatus of claim 1, further comprising a plurality of preamplifiers disposed between said plurality of RF coils and said plurality of signal preprocessors, wherein said plurality of preamplifiers are arranged to directly amplify the received signals from said RF coils.

4. A magnetic resonance imaging apparatus according to claim 1, wherein said plurality of RF coils are arranged in a single row.

5. A magnetic resonance imaging apparatus according to claim 1, wherein said plurality of RF coils are arranged in a two-dimensional pattern.

* * * * *

UNITED STATES PATENT AND TRADEMARK OFFICE
CERTIFICATE OF CORRECTION

PATENT NO. : 5,122,749
DATED     : June 16, 1992
INVENTOR(S) : Kazuya Hoshino

It is certified that error appears in the above-identified patent and that said Letters Patent is hereby corrected as shown below:

ON TITLE PAGE:       Item [75]

The inventor should read "Kazuya Hoshino".

Signed and Sealed this

Twenty-ninth Day of September, 1992

Attest:

DOUGLAS B. COMER

*Attesting Officer*              Acting Commissioner of Patents and Trademarks